US012628504B2

(12) United States Patent
Shiomi

(10) Patent No.: US 12,628,504 B2
(45) Date of Patent: May 12, 2026

(54) DISPLAY DEVICE

(71) Applicant: Magnolia White Corporation, Tokyo (JP)

(72) Inventor: Naoki Shiomi, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 461 days.

(21) Appl. No.: 18/447,331

(22) Filed: Aug. 10, 2023

(65) Prior Publication Data

US 2024/0057396 A1    Feb. 15, 2024

(30) Foreign Application Priority Data

Aug. 12, 2022    (JP) ................................. 2022-128857

(51) Int. Cl.
  *H10K 59/122*        (2023.01)
  *H10K 59/80*         (2023.01)
(52) U.S. Cl.
  CPC ..... *H10K 59/122* (2023.02); *H10K 59/80524* (2023.02)
(58) Field of Classification Search
  CPC .......... H10K 59/122; H10K 59/80524; H10K 59/1201; H10K 59/123; H10K 59/131; H10K 71/164
  See application file for complete search history.

(56) References Cited

U.S. PATENT DOCUMENTS

| | | |
|---|---|---|
| 2003/0227253 A1 | 12/2003 | Seo et al. |
| 2004/0160170 A1 | 8/2004 | Sato et al. |
| 2009/0009069 A1 | 1/2009 | Takata |
| 2019/0348488 A1 | 11/2019 | Terai et al. |
| 2019/0363275 A1 | 11/2019 | Ochi et al. |
| 2022/0077251 A1* | 3/2022 | Choung ............... H10K 59/873 |

FOREIGN PATENT DOCUMENTS

| | | |
|---|---|---|
| JP | 2000-195677 A | 7/2000 |
| JP | 2004-207217 A | 7/2004 |
| JP | 2008-135325 A | 6/2008 |
| JP | 2009-032673 A | 2/2009 |
| JP | 2010-118191 A | 5/2010 |
| JP | 2019-197621 A | 11/2019 |
| JP | 2020-178137 A | 10/2020 |
| WO | 2018/179308 A1 | 10/2018 |

* cited by examiner

*Primary Examiner* — Anne M Hines
*Assistant Examiner* — Jose M Diaz
(74) *Attorney, Agent, or Firm* — XSENSUS LLP

(57) ABSTRACT

According to an embodiment, a display device includes a lower electrode, a rib including an aperture overlapping the lower electrode, a partition including a lower portion on the rib and an upper portion protruding from a side surface of the lower electrode, an upper electrode which faces the lower electrode and is formed of a metal material, an organic layer between the lower and upper electrodes, and a transparent conductive layer covering the upper electrode. According to an aspect of the embodiment, the side surface of the lower portion includes a recess, and the conductive layer is in contact with, of the side surface of the lower portion, an area located above the recess.

20 Claims, 15 Drawing Sheets

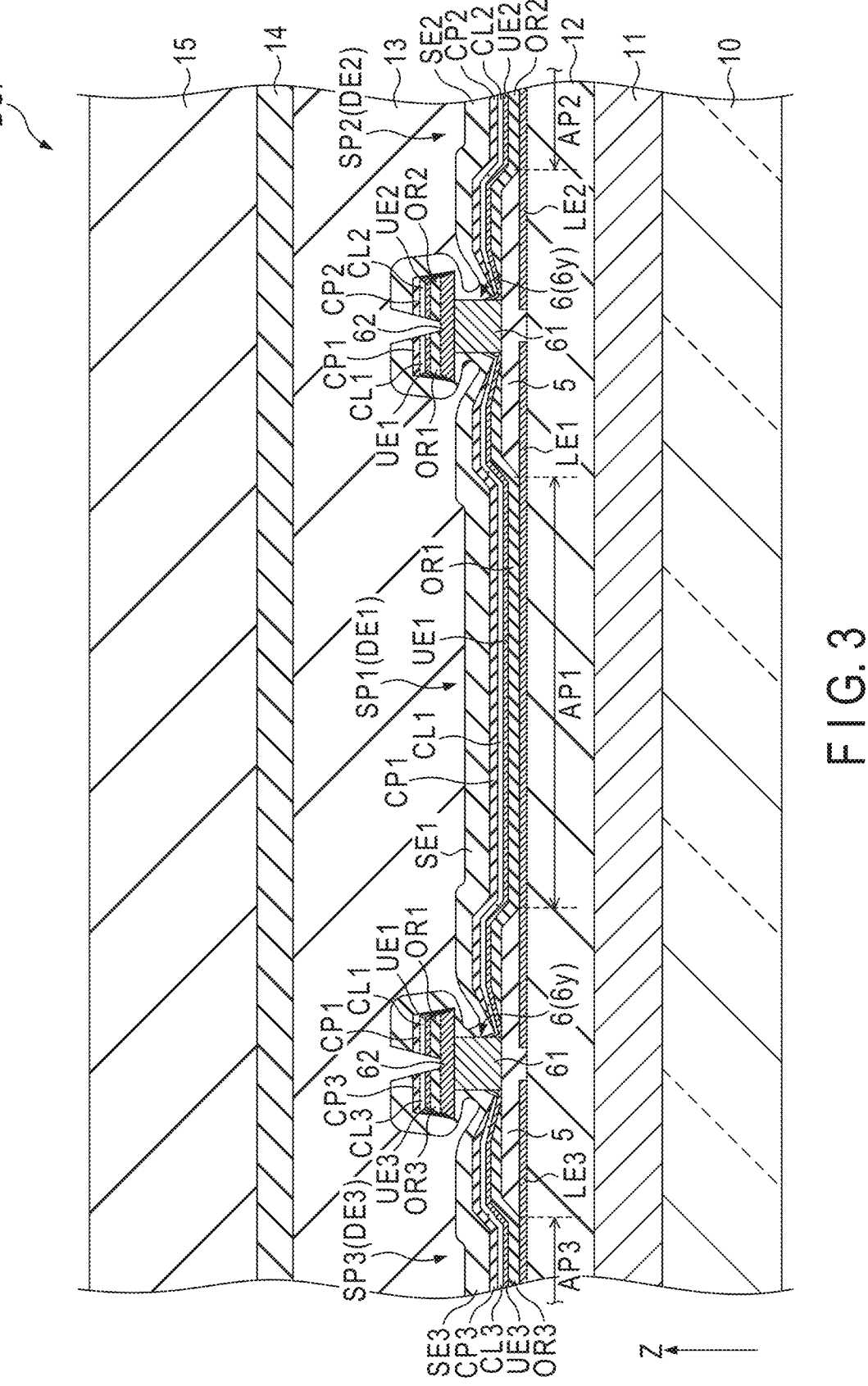
F I G. 3

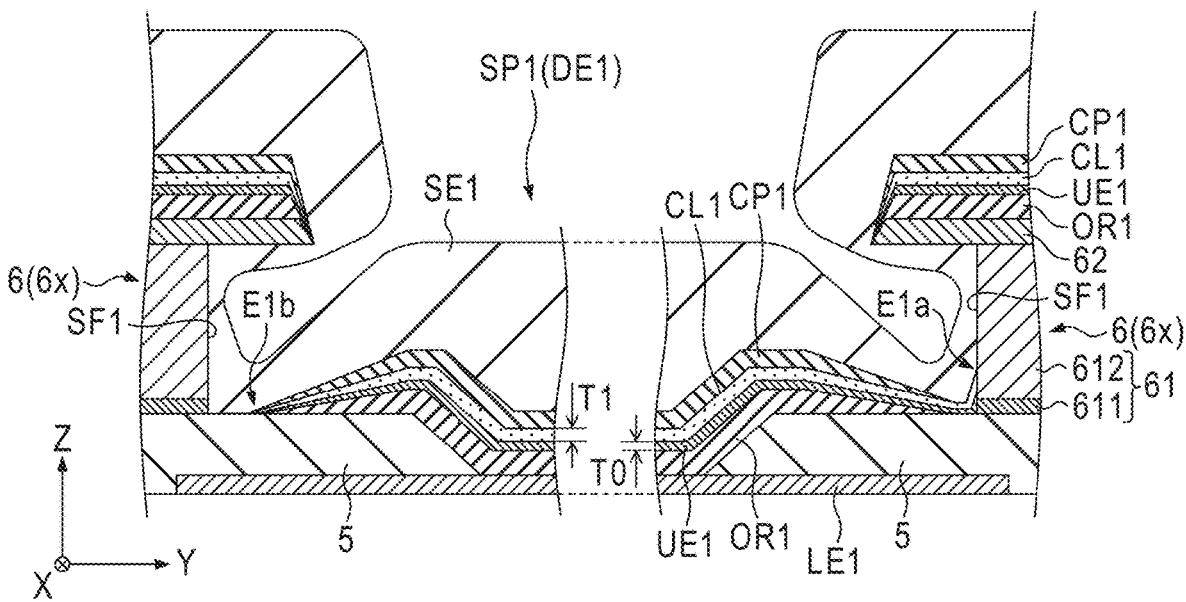
F I G. 4
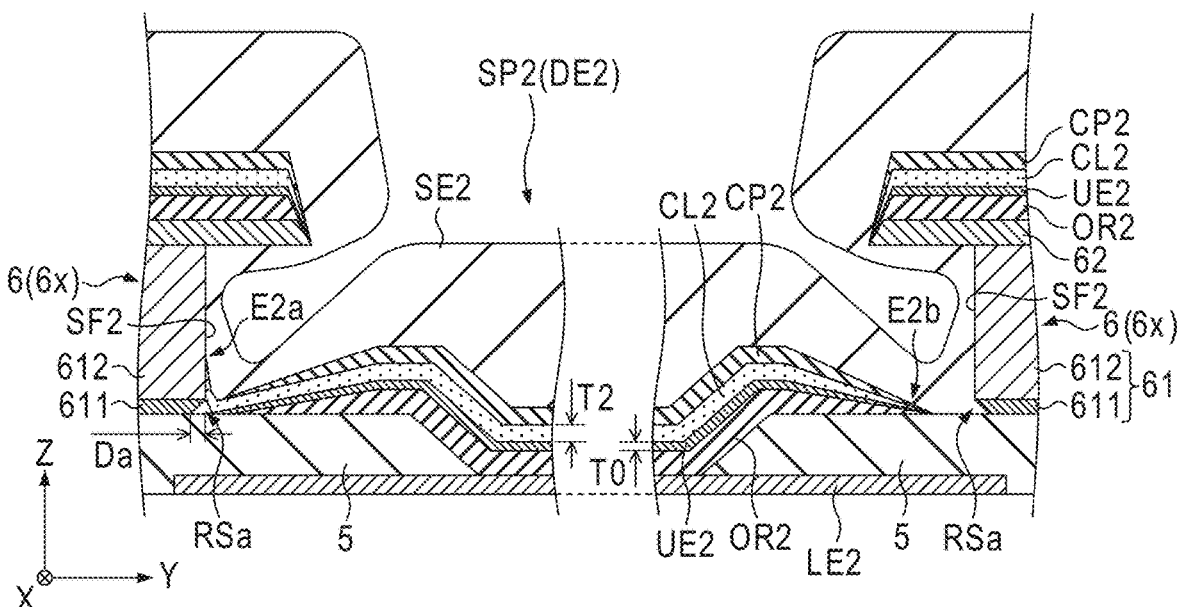
F I G. 5

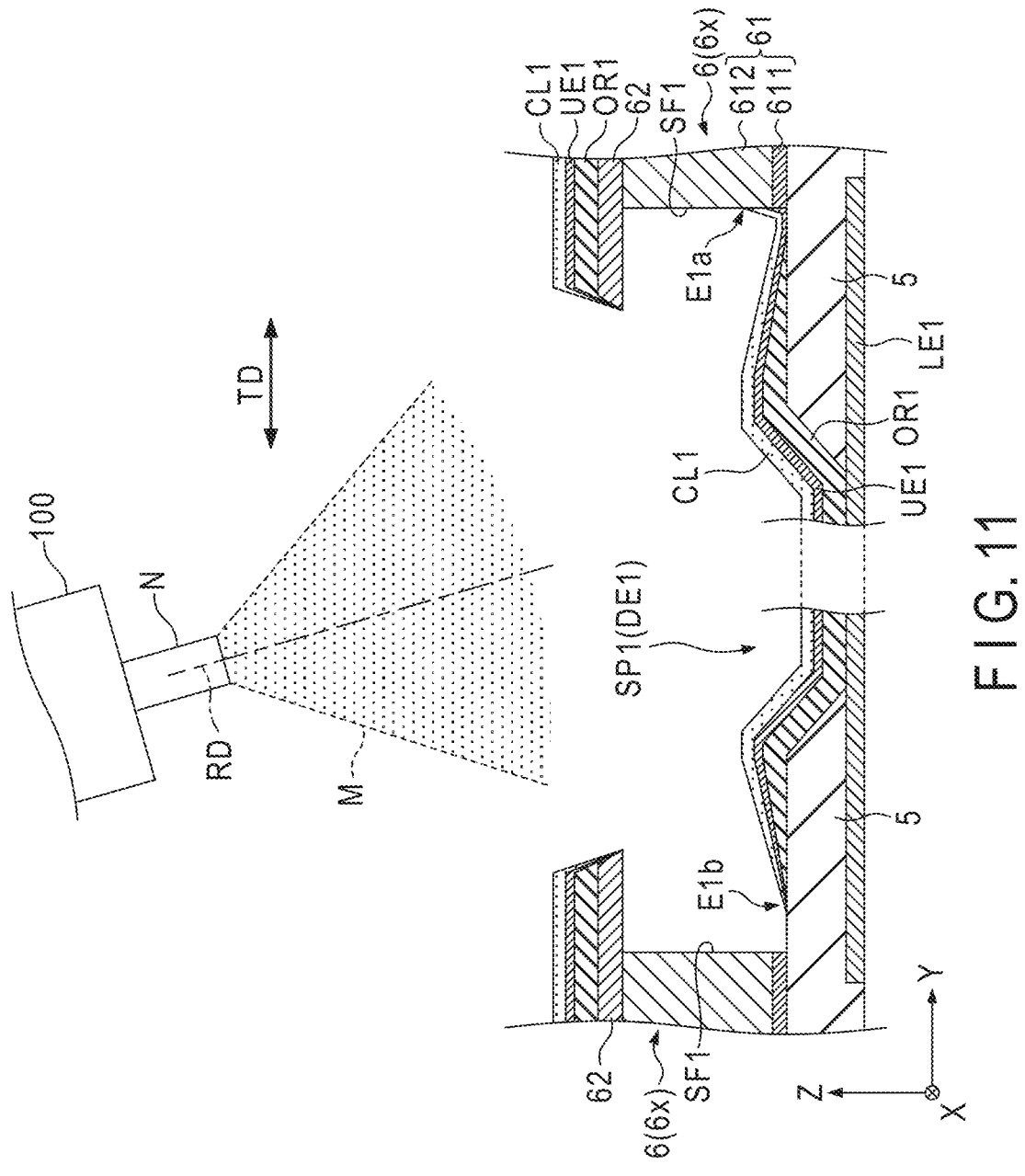
F I G. 11

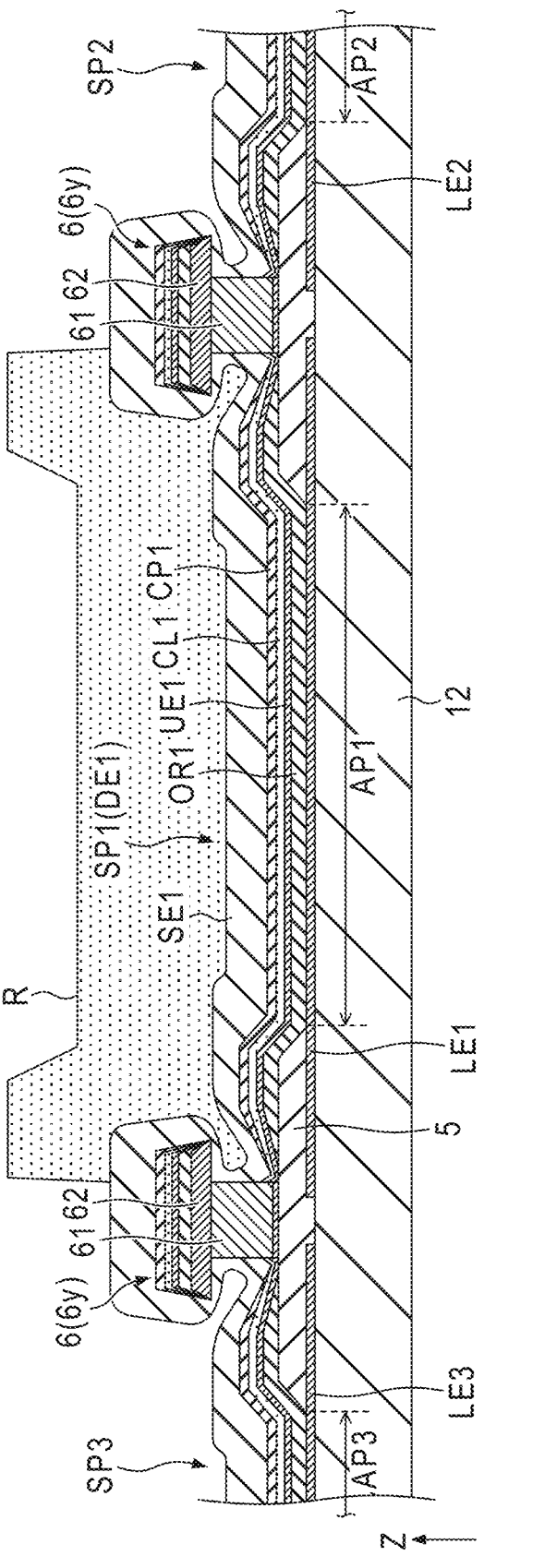
F I G. 12

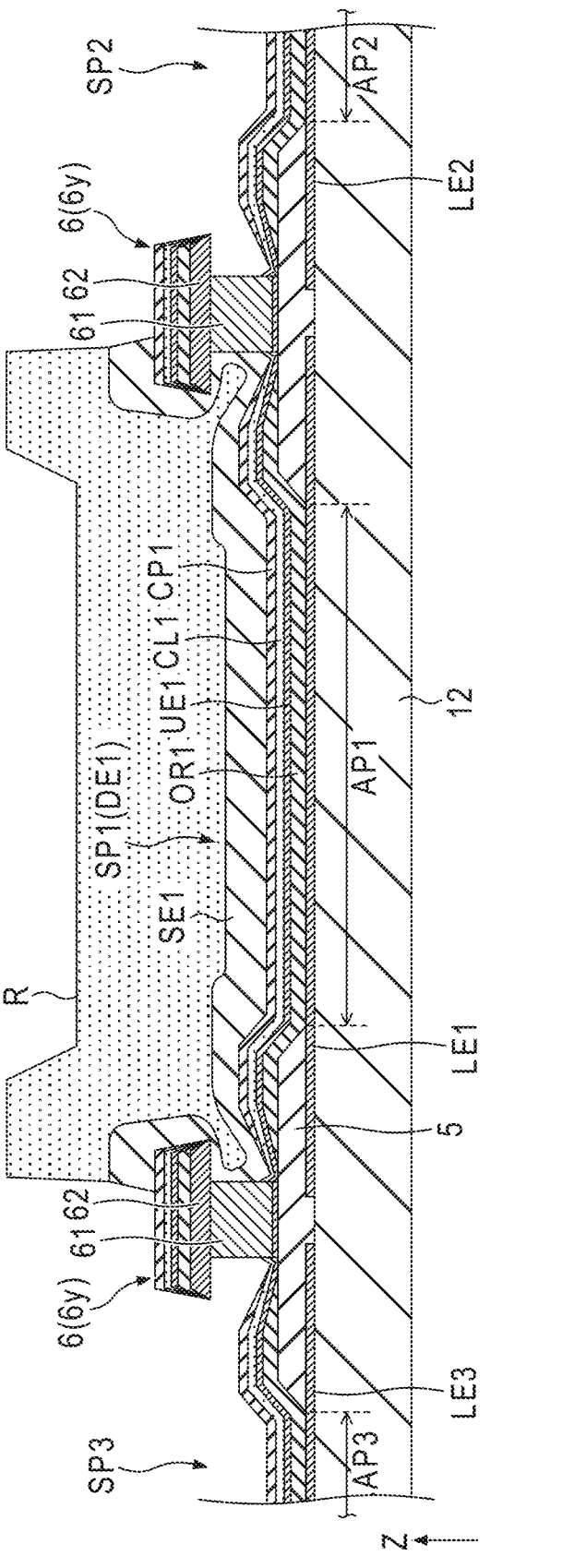
F I G. 13

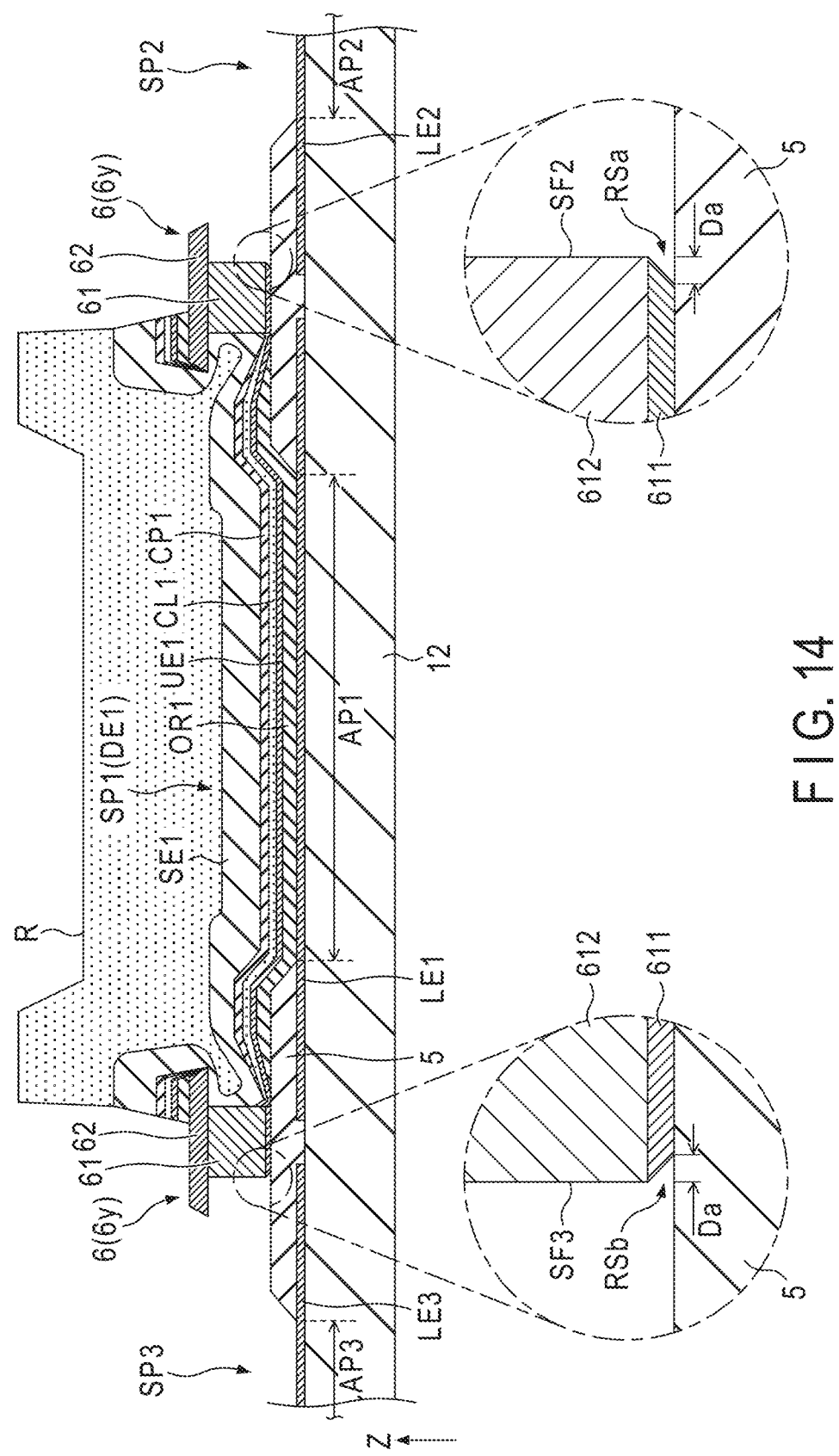
F I G. 14

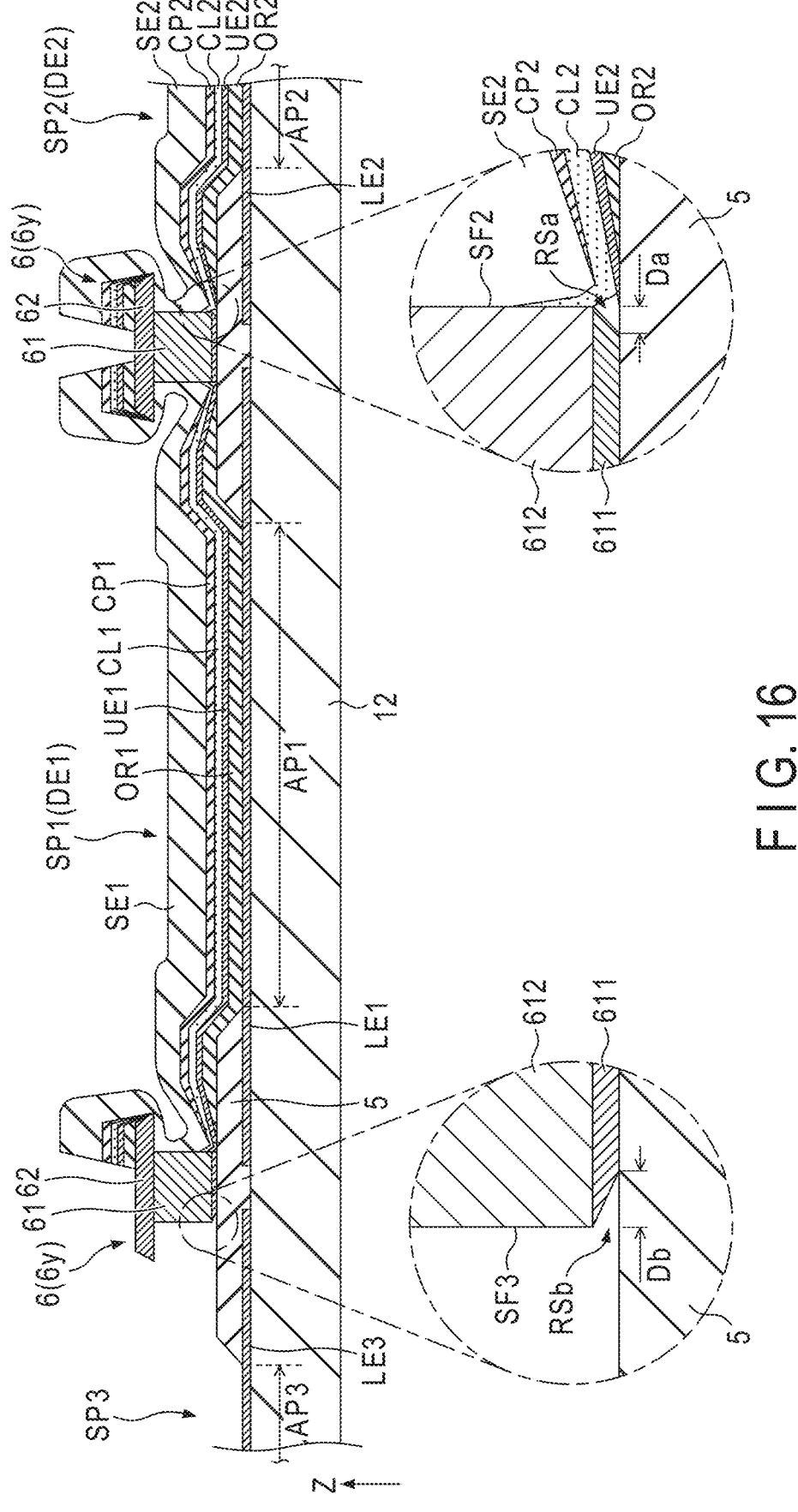
F I G. 16

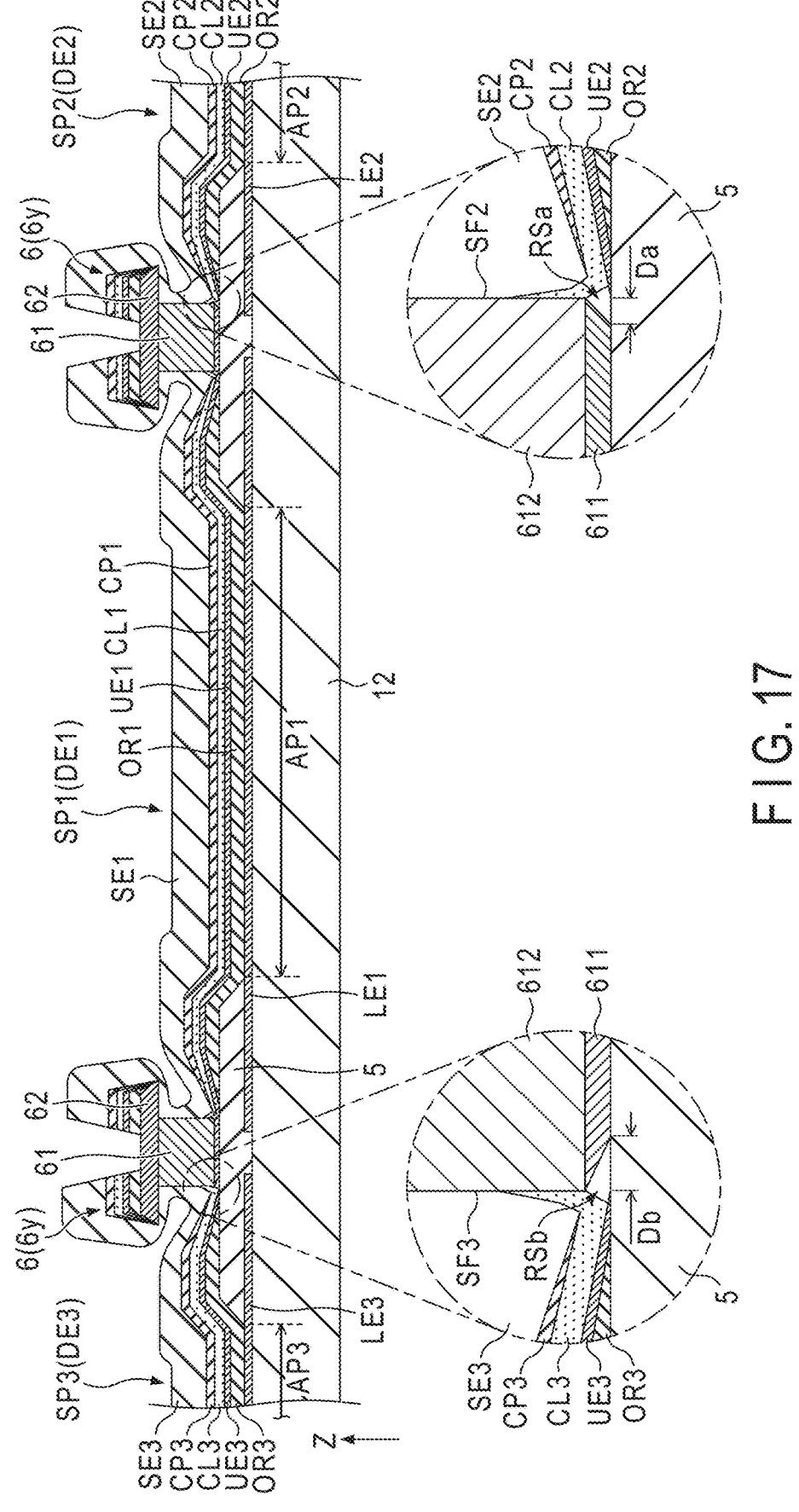
F I G. 17

DISPLAY DEVICE

CROSS-REFERENCE TO RELATED APPLICATIONS

This application is based upon and claims the benefit of priority from Japanese Patent Application No. 2022-128857, filed Aug. 12, 2022, the entire contents of which are incorporated herein by reference.

FIELD

Embodiments described herein relate generally to a display device.

BACKGROUND

Recently, display devices to which an organic light emitting diode (OLED) is applied as a display element have been put into practical use. This display element comprises a lower electrode, an organic layer which covers the lower electrode, and an upper electrode which covers the organic layer.

When such a display device is manufactured, a technique which improves reliability is required.

BRIEF DESCRIPTION OF THE DRAWINGS

FIG. 3 is a schematic cross-sectional view of the display device along the III-III line of FIG. 2.

FIG. 4 is a schematic cross-sectional view of the display device along the IV-IV line of FIG. 2.

FIG. 5 is a schematic cross-sectional view of the display device along the V-V line of FIG. 2.

FIG. 11 is a schematic diagram showing an evaporation method of a conductive layer, etc.

FIG. 12 is a schematic cross-sectional view showing a manufacturing process following FIG. 10.

FIG. 13 is a schematic cross-sectional view showing a manufacturing process following FIG. 12.

FIG. 14 is a schematic cross-sectional view showing a manufacturing process following FIG. 13.

FIG. 16 is a schematic cross-sectional view showing a manufacturing process following FIG. 15.

FIG. 17 is a schematic cross-sectional view showing a manufacturing process following FIG. 16.

DETAILED DESCRIPTION

Figure 1:
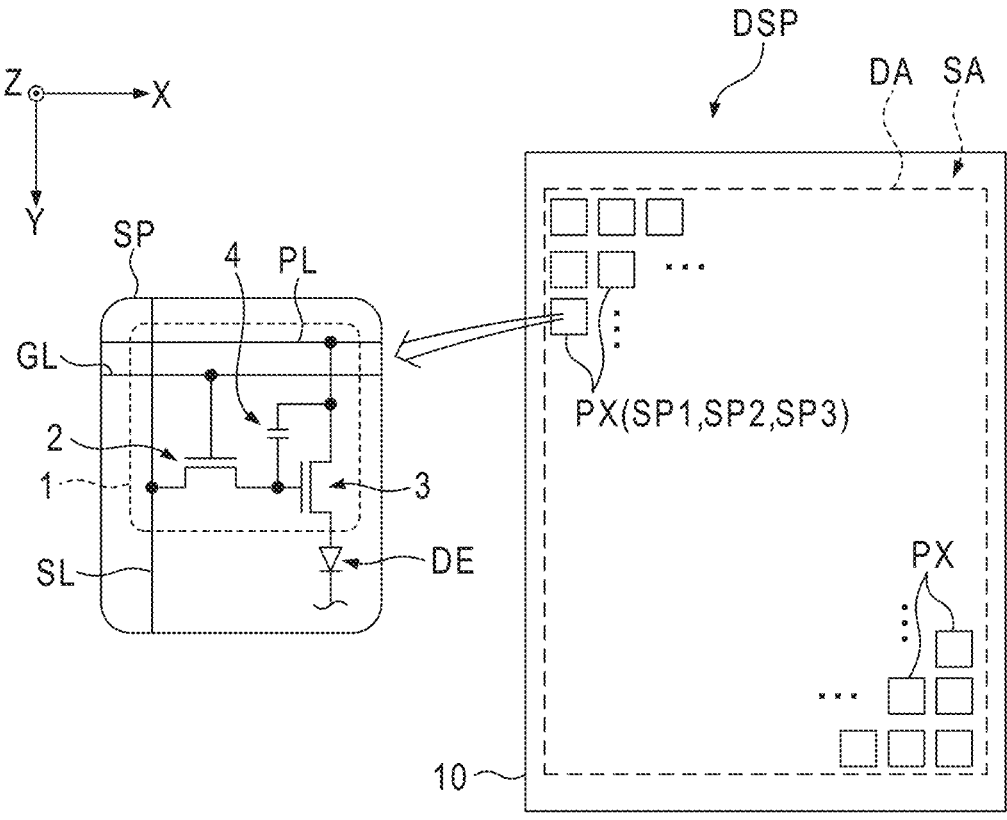
FIG. 1 is a diagram showing a configuration example of a display device according to an embodiment.

In general, according to one embodiment, a display device comprises a lower electrode, a rib which covers a part of the lower electrode and comprises an aperture overlapping the lower electrode, a partition comprising a lower portion provided on the rib and an upper portion which protrudes from a side surface of the lower portion, an upper electrode which faces the lower electrode and is formed of a metal material, an organic layer which is located between the lower electrode and the upper electrode and emits light based on a potential difference between the lower electrode and the upper electrode, and a transparent conductive layer which covers the upper electrode.

According to an aspect of the embodiment, the side surface of the lower portion includes a recess, and the conductive layer is in contact with, of the side surface of the lower portion, an area located above the recess.

According to another aspect of the embodiment, the lower portion includes a first metal layer, and a second metal layer provided on the first metal layer, and the conductive layer is in contact with a side surface of the second metal layer.

According to yet another aspect of the embodiment, the conductive layer is formed of an organic conductive material and is in contact with the side surface of the lower portion.

These configurations can provide a display device in which the yield can be improved in the manufacturing process.

Embodiments will be described with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as a first direction X. A direction parallel to the Y-axis is referred to as a second direction Y. A direction parallel to the Z-axis is referred to as a third direction Z. When various elements are viewed parallel to the third direction Z, the appearance is defined as a plan view.

The display device of the present embodiment is an organic electroluminescent display device comprising an organic light emitting diode (OLED) as a display element, and could be mounted on a television, a personal computer, a vehicle-mounted device, a tablet, a smartphone, a mobile phone, etc.

FIG. 1 is a diagram showing a configuration example of a display device DSP according to an embodiment. The display device DSP comprises a display area DA which displays an image and a surrounding area SA around the display area DA on an insulating substrate 10. The substrate 10 may be glass or a resinous film having flexibility.

In the present embodiment, the substrate 10 is rectangular as seen in plan view. It should be noted that the shape of the substrate 10 in plan view is not limited to a rectangular shape and may be another shape such as a square shape, a circular shape or an elliptic shape.

The display area DA comprises a plurality of pixels PX arrayed in matrix in a first direction X and a second direction Y. Each pixel PX includes a plurality of subpixels SP. For example, each pixel PX includes a blue subpixel SP1 (first subpixel), a green subpixel SP2 (second subpixel) and a red subpixel SP3 (third subpixel). Each pixel PX may include a subpixel SP which exhibits another color such as white in addition to subpixels SP1, SP2 and SP3 or instead of one of subpixels SP1, SP2 and SP3.

Each subpixel SP comprises a pixel circuit 1 and a display element DE driven by the pixel circuit 1. The pixel circuit 1 comprises a pixel switch 2, a drive transistor 3 and a capacitor 4. The pixel switch 2 and the drive transistor 3 are, for example, switching elements consisting of thin-film transistors.

The gate electrode of the pixel switch 2 is connected to a scanning line GL. One of the source electrode and drain electrode of the pixel switch 2 is connected to a signal line SL. The other one is connected to the gate electrode of the drive transistor 3 and the capacitor 4. In the drive transistor 3, one of the source electrode and the drain electrode is connected to a power line PL and the capacitor 4, and the other one is connected to the display element DE. The display element DE is an organic light emitting diode (OLED) as a light emitting element.

It should be noted that the configuration of the pixel circuit 1 is not limited to the example shown in the figure. For example, the pixel circuit 1 may comprise more thin-film transistors and capacitors.

Figure 2:
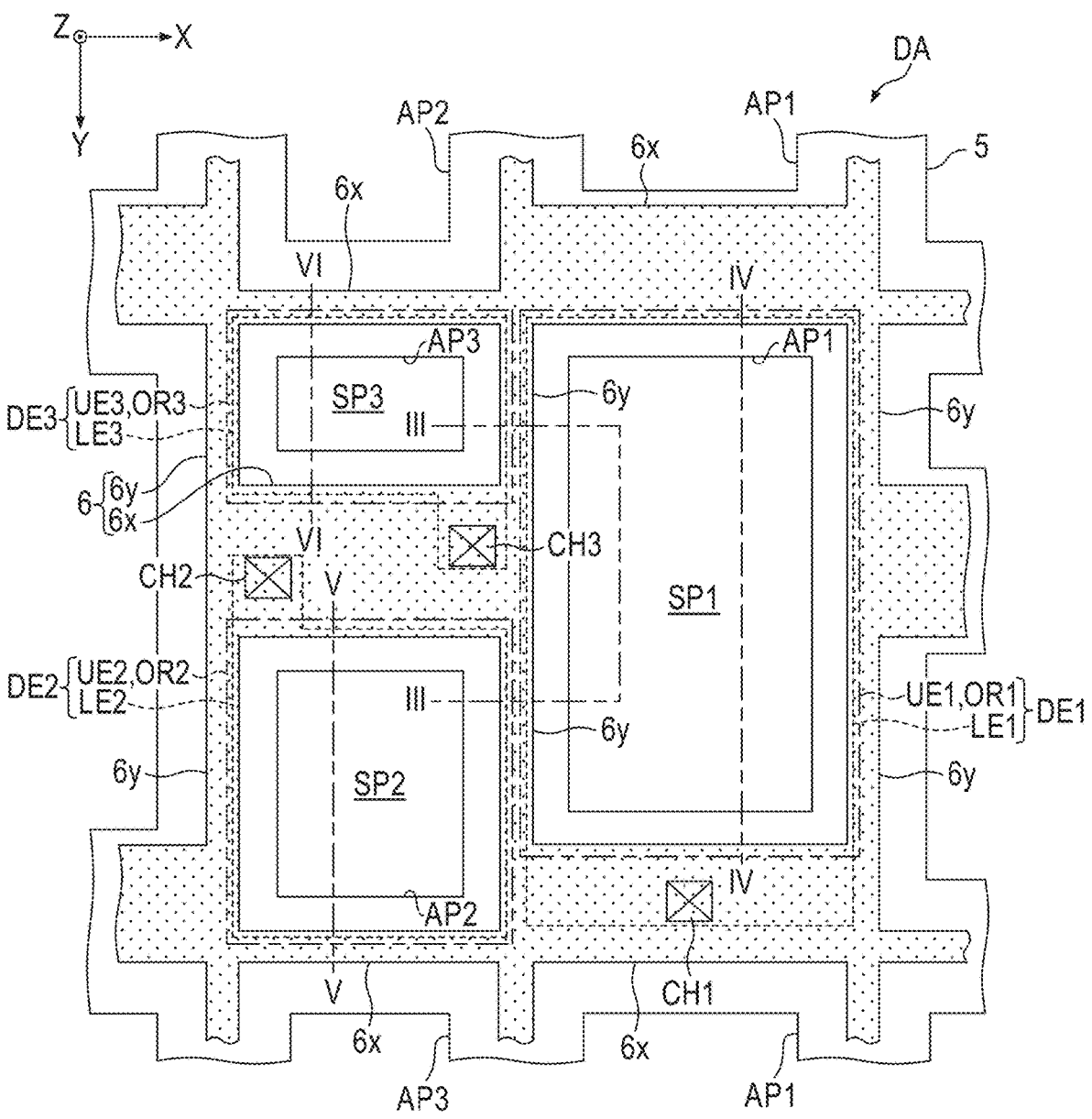
FIG. 2 is a diagram showing an example of the layout of subpixels.

FIG. 2 is a diagram showing an example of the layout of subpixels SP1, SP2 and SP3. In the example of FIG. 2, subpixels SP1 and SP2 are arranged in the first direction X. Subpixels SP1 and SP3 are also arranged in the first direction X. Further, subpixels SP2 and SP3 are arranged in the second direction Y.

When subpixels SP1, SP2 and SP3 are provided in line with this layout, in the display area DA, a column in which subpixels SP2 and SP3 are alternately provided in the second direction Y and a column in which a plurality of subpixels SP1 are repeatedly provided in the second direction Y are formed. These columns are alternately arranged in the first direction X.

It should be noted that the layout of subpixels SP1, SP2 and SP3 is not limited to the example of FIG. 2. As another example, subpixels SP1, SP2 and SP3 in each pixel PX may be arranged in order in the first direction X.

A rib 5 and a partition 6 are provided in the display area DA. The rib 5 comprises a pixel aperture AP1 in subpixel SP1, comprises a pixel aperture AP2 in subpixel SP2 and comprises a pixel aperture AP3 in subpixel SP3.

In the example of FIG. 2, the area of the pixel aperture AP1 is greater than that of the pixel aperture AP2. The area of the pixel aperture AP1 is greater than that of the pixel aperture AP3. Further, the area of the pixel aperture AP3 is less than that of the pixel aperture AP2.

The partition 6 is provided in the boundary between adjacent subpixels SP and overlaps the rib 5 as seen in plan view. The partition 6 comprises a plurality of first partitions 6x extending in the first direction X and a plurality of second partitions 6y extending in the second direction Y. The first partitions 6x are provided between the pixel apertures AP2 and AP3 which are adjacent to each other in the second direction Y and between two pixel apertures AP1 which are adjacent to each other in the second direction Y. Each second partition 6y is provided between the pixel apertures AP1 and AP2 which are adjacent to each other in the first direction X and between the pixel apertures AP1 and AP3 which are adjacent to each other in the first direction X.

In the example of FIG. 2, the first partitions 6x and the second partitions 6y are connected to each other. In this configuration, the partition 6 has a grating shape surrounding the pixel apertures AP1, AP2 and AP3 as a whole. In other words, the partition 6 comprises apertures in subpixels SP1, SP2 and SP3 in a manner similar to that of the rib 5.

Subpixel SP1 comprises a lower electrode LE1, an upper electrode UE1 and an organic layer OR1 overlapping the pixel aperture AP1. Subpixel SP2 comprises a lower electrode LE2, an upper electrode UE2 and an organic layer OR2 overlapping the pixel aperture AP2. Subpixel SP3 comprises a lower electrode LE3, an upper electrode UE3 and an organic layer OR3 overlapping the pixel aperture AP3.

The lower electrode LE1, the upper electrode UE1 and the organic layer OR1 constitute the display element DE1 of subpixel SP1. The lower electrode LE2, the upper electrode UE2 and the organic layer OR2 constitute the display element DE2 of subpixel SP2. The lower electrode LE3, the upper electrode UE3 and the organic layer OR3 constitute the display element DE3 of subpixel SP3. Each of the display elements DE1, DE2 and DE3 may include a cap layer as described later.

The lower electrode LE1 is connected to the pixel circuit 1 (see FIG. 1) of subpixel SP1 through a contact hole CH1. The lower electrode LE2 is connected to the pixel circuit 1 of subpixel SP2 through a contact hole CH2. The lower electrode LE3 is connected to the pixel circuit 1 of subpixel SP3 through a contact hole CH3.

In the example of FIG. 2, the contact holes CH2 and CH3 entirely overlap the first partition 6X between the pixel apertures AP2 and AP3 which are adjacent to each other in the second direction Y. The contact hole CH1 entirely overlaps the first partition 6x between two pixel apertures AP1 which are adjacent to each other in the second direction Y. As another example, at least part of the contact hole CH1, CH2 or CH3 may not overlap the first partition 6x.

FIG. 3 is a schematic cross-sectional view of the display device DSP along the III-III line of FIG. 2. A circuit layer 11 is provided on the substrate 10 described above. The circuit layer 11 includes various circuits and lines such as the pixel circuit 1, scanning line GL, signal line SL and power line PL shown in FIG. 1.

The circuit layer 11 is covered with an organic insulating layer 12. The organic insulating layer 12 functions as a planarization film which planarizes the irregularities formed by the circuit layer 11. Although not shown in the section of FIG. 3, all of the contact holes CH1, CH2 and CH3 described above are provided in the organic insulating layer 12.

The lower electrodes LE1, LE2 and LE3 are provided on the organic insulating layer 12. The rib 5 is provided on the organic insulating layer 12 and the lower electrodes LE1, LE2 and LE3. The end portions of the lower electrodes LE1, LE2 and LE3 are covered with the rib 5.

The partition 6 includes a conductive lower portion 61 provided on the rib 5 and an upper portion 62 provided on the lower portion 61. The upper portion 62 has a width greater than that of the lower portion 61. By this configuration, in FIG. 3, the both end portions of the upper portion 62 protrude relative to the side surfaces of the lower portion 61. This shape of the partition 6 may be called an overhang shape.

The organic layer OR1 covers the lower electrode LE1 through the pixel aperture AP1. The upper electrode UE1 covers the organic layer OR1 and faces the lower electrode LE1. The organic layer OR2 covers the lower electrode LE2 through the pixel aperture AP2. The upper electrode UE2 covers the organic layer OR2 and faces the lower electrode LE2. The organic layer OR3 covers the lower electrode LE3 through the pixel aperture AP3. The upper electrode UE3 covers the organic layer OR3 and faces the lower electrode LE3.

Conductive layers CL1, CL2 and CL3 are provided in subpixels SP1, SP2 and SP3, respectively. The conductive layer CL1 covers the upper electrode UE1. The conductive layer CL2 covers the upper electrode UE2. The conductive layer CL3 covers the upper electrode UE3.

In the example of FIG. 3, cap layers CP1, CP2 and CP3 are provided in subpixels SP1, SP2 and SP3, respectively. The cap layer CP1 covers the conductive layer CL1. The cap layer CP2 covers the conductive layer CL2. The cap layer CP3 covers the conductive layer CL3.

Further, sealing layers SE1, SE2 and SE3 are provided in subpixels SP1, SP2 and SP3, respectively. The sealing layer SE1 continuously covers, of the partition 6 surrounding subpixel SP1, a portion which is close to subpixel SP1, and the cap layer CP1. The sealing layer SE2 continuously covers, of the partition 6 surrounding subpixel SP2, a portion which is close to subpixel SP2, and the cap layer CP2. The sealing layer SE3 continuously covers, of the partition 6 surrounding subpixel SP3, a portion which is close to subpixel SP3, and the cap layer CP3.

The organic layer OR1, the upper electrode UE1, the conductive layer CL1 and the cap layer CP1 are partly located on the upper portion 62. These portions are spaced apart from, of the organic layer OR1, the upper electrode UE1, the conductive layer CL1 and the cap layer CP1, the portions located on the rib 5. Similarly, the organic layer OR2, the upper electrode UE2, the conductive layer CL2 and the cap layer CP2 are partly located on the upper portion 62, and these portions are spaced apart from, of the organic layer OR2, the upper electrode UE2, the conductive layer CL2 and the cap layer CP2, the portions located on the rib 5. Further, the organic layer OR3, the upper electrode UE3, the conductive layer CL3 and the cap layer CP3 are partly located on the upper portion 62, and these portions are spaced apart from, of the organic layer OR3, the upper electrode UE3, the conductive layer CL3 and the cap layer CP3, the portions located on the rib 5.

In the example of FIG. 3, the organic layer OR1, the upper electrode UE1, the conductive layer CL1, the cap layer CP1 and the sealing layer SE1 on the partition 6 between subpixels SP1 and SP2 are spaced apart from the organic layer OR2, the upper electrode UE2, the conductive layer CL2, the cap layer CP2 and the sealing layer SE2 on this partition 6. Further, the organic layer OR1, the upper electrode UE1, the conductive layer CL1, the cap layer CP1 and the sealing layer SE1 on the partition 6 between subpixels SP1 and SP3 are spaced apart from the organic layer OR3, the upper electrode UE3, the conductive layer CL3, the cap layer CP3 and the sealing layer SE3 on this partition 6.

The sealing layers SE1, SE2 and SE3 are covered with a resin layer 13. The resin layer 13 is covered with a sealing layer 14. Further, the sealing layer 14 is covered with a resin layer 15.

Each of the organic insulating layer 12 and the resin layers 13 and 15 is formed of an organic material. Each of the rib 5, the sealing layers SE1, SE2, SE3 and the sealing layer 14 is formed of, for example, an inorganic material such as silicon nitride (SiNx), silicon oxide (SiOx) or silicon oxynitride (SiON).

Each of the lower electrodes LE1, LE2 and LE3 comprises an intermediate layer formed of, for example, silver (Ag), and a pair of conductive oxide layers covering the upper and lower surfaces of the intermediate layer. Each conductive oxide layer may be formed of, for example, a transparent conductive oxide such as indium tin oxide (ITO), indium zinc oxide (IZO) or indium gallium zinc oxide (IGZO).

For example, each of the organic layers OR1, OR2 and OR3 comprises a multilayer structure consisting of a hole injection layer, a hole transport layer, an electron blocking layer, a light emitting layer, a hole blocking layer, an electron transport layer and an electron injection layer.

Each of the upper electrodes UE1, UE2 and UE3 is formed of, for example, a metal material such as an alloy of magnesium and silver (MgAg).

Each of the conductive layers CL1, CL2 and CL3 is formed of a transparent conductive material. For the conductive material, for example, an organic conductive material having a light transmitting property relative to light with wavelengths in a visible range can be used. For example, the organic conductive material is a conductive polymeric material comprising an aromatic ring. For example, the conductive polymeric material comprising an aromatic ring is polythiophene or polyaniline. Alternatively, each of the conductive layers CL1, CL2 and CL3 may be formed of a material in which a conductive transparent inorganic material is contained in a transparent resinous material having a less conductivity.

As yet another example, each of the conductive layers CL1, CL2 and CL3 may be formed of an inorganic conductive material having a light transmitting property relative to light with wavelengths in a visible range. For the inorganic conductive material, for example, ITO, IZO or IGZO can be used.

For example, the lower electrodes LE1, LE2 and LE3 correspond to the anodes of the display elements DE1, DE2 and DE3, respectively. The upper electrodes UE1, UE2 and UE3 and the conductive layers CL1, CL2 and CL3 correspond to the cathodes of the display elements DE1, DE2 and DE3, respectively.

The cap layers CP1, CP2 and CP3 are formed of materials having refractive indices which are different from those of the conductive layers CL1, CL2 and CL3. For example, the refractive index of each of the cap layers CP1, CP2 and CP3 is less than that of each of the conductive layers CL1, CL2 and CL3. These cap layers CP1, CP2 and CP3 may be formed of, for example, lithium fluoride (LiF). Each of the cap layers CP1, CP2 and CP3 may be a multilayer body in which a plurality of materials having different refractive indices are stacked.

Common voltage is applied to the partition 6. This common voltage is applied to each of the upper electrodes UE1, UE2 and UE3 and the conductive layers CL1, CL2 and CL3 which are in contact with the side surfaces of the lower portions 61. Pixel voltage is applied to the lower electrodes LE1, LE2 and LE3 through the pixel circuits 1 provided in subpixels SP1, SP2 and SP3, respectively.

When a potential difference is formed between the lower electrode LE1 and the upper electrode UE1, the light emitting layer of the organic layer OR1 emits light in a blue wavelength range. When a potential difference is formed between the lower electrode LE2 and the upper electrode UE2, the light emitting layer of the organic layer OR2 emits light in a green wavelength range. When a potential difference is formed between the lower electrode LE3 and the upper electrode UE3, the light emitting layer of the organic layer OR3 emits light in a red wavelength range.

Figure 6:
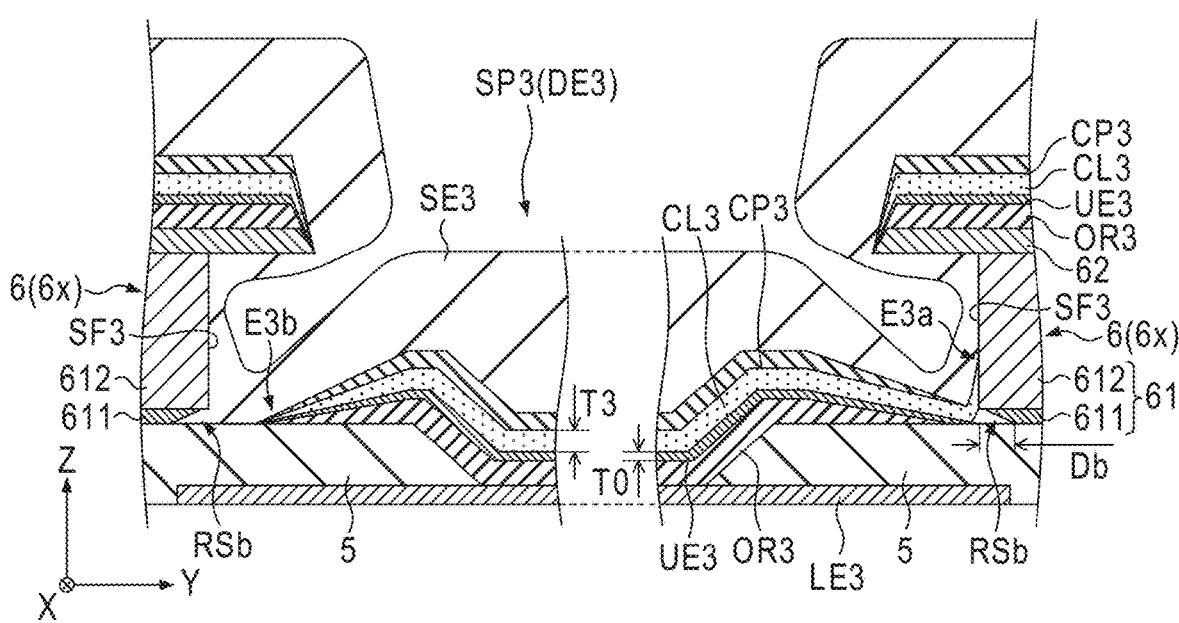
FIG. 6 is a schematic cross-sectional view of the display device along the VI-VI line of FIG. 2.

FIG. 4 is a schematic cross-sectional view of the display device DSP along the IV-IV line of FIG. 2 and shows subpixel SP1 and part of the partition 6 (first partitions 6x) around the subpixel. FIG. 5 is a schematic cross-sectional view of the display device DSP along the V-V line of FIG. 2 and shows subpixel SP2 and part of the partition 6 (first partitions 6x) around the subpixel. FIG. 6 is a schematic cross-sectional view of the display device DSP along the VI-VI line of FIG. 2 and shows subpixel SP3 and part of the partition 6 (first partitions 6x) around the subpixel. The section of each of FIG. 4 to FIG. 6 is taken along the Y-Z plane. In FIG. 4 to FIG. 6, the substrate 10, the circuit layer 11, the organic insulating layer 12, the resin layer 13, the sealing layer 14 and the resin layer 15 are omitted.

As shown in FIG. 4 to FIG. 6, the lower portion 61 of the partition 6 includes a first metal layer 611 and a second metal layer 612. The first metal layer 611 is provided on the rib 5. The second metal layer 612 is formed so as to be thicker than the first metal layer 611 and is provided on the first metal layer 611.

The first metal layer 611 may be formed of, for example, molybdenum (Mo). The second metal layer 612 may be formed of, for example, aluminum (Al). The second metal layer 612 may be formed of an aluminum alloy such as an aluminum-neodymium alloy (AlNd) or may comprise a multilayer structure consisting of an aluminum layer and an aluminum alloy layer. The lower portion 61 may not include the first metal layer 611.

The upper portion 62 of the partition 6 is formed of, for example, a metal material such as titanium (Ti). The upper portion 62 may comprise a multilayer structure consisting of a metal material and a conductive oxide such as ITO. Alternatively, the upper portion 62 may be formed of an inorganic insulating material such as silicon oxide, or may comprise a multilayer structure consisting of an inorganic insulating material and a conductive oxide such as ITO.

As shown in FIG. 4, the lower portion 61 which is adjacent to subpixel SP1 comprises a side surface SF1. The side surface SF1 consists of the respective side surfaces of the metal layers 611 and 612. In the example of FIG. 4, the side surface SF1 is flat.

The upper electrode UE1 is in contact with the side surface SF1 of the partition 6 located on the right side of FIG. 4. More specifically, the upper electrode UE1 entirely covers the side surface of the first metal layer 611 and also covers part of the side surface of the second metal layer 612.

The conductive layer CL1 entirely covers the upper electrode UE1. Further, an end portion E1a of the conductive layer CL1 is in contact with, of the side surface SF1 of the partition 6 located on the right side of FIG. 4, the area located above the portion covered with the upper electrode UE1. The other end portion E1b of the conductive layer CL1 is located on the rib 5. In other words, in the example of FIG. 4, neither the upper electrode UE1 nor the conductive layer CL1 is in contact with the side surface SF1 of the left partition 6. It should be noted that the right partition 6 which is in contact with the upper electrode UE1 and the conductive layer CL1 corresponds to the first partition 6x which overlaps the contact hole CH1 in FIG. 2.

The sealing layer SE1 covers the entire conductive layer CL1 including the end portions E1a and E1b. The sealing layer SE1 is in contact with, of each side surface SF1, the area which is not covered with the conductive layer CL1.

As shown in FIG. 5, the lower portion 61 which is adjacent to subpixel SP2 comprises a side surface SF2. The side surface SF2 consists of the respective side surfaces of the metal layers 611 and 612. In the example of FIG. 5, the side surface of the first metal layer 611 is retracted relative to the side surface of the second metal layer 612. By this configuration, a recess RSa along the upper surface of the rib 5 is formed in the side surface SF2.

In the example of FIG. 5, the upper electrode UE2 is not in contact with the side surface SF2 of the left partition 6. Alternatively, the upper electrode UE2 may be in contact with at least one of the side surfaces SF2 of the right and left partitions 6.

The conductive layer CL2 entirely covers the upper electrode UE2. Further, an end portion E2a of the conductive layer CL2 is in contact with the side surface SF2 of the partition 6 located on the left side of FIG. 5. More specifically, the conductive layer CL2 blocks the gap between the recess RSa and the rib 5, and is in contact with, of the side surface SF2, the area located above the recess RSa (part of the side surface of the second metal layer 612). The conductive layer CL2 and the upper electrode UE2 may fill at least part of the recess RSa.

The other end portion E2b of the conductive layer CL2 is located on the rib 5. In other words, in the example of FIG. 5, the conductive layer CL2 is not in contact with the side surface SF2 of the right partition 6. It should be noted that the left partition 6 which is in contact with the conductive layer CL2 corresponds to the first partition 6x which overlaps the contact hole CH2 in FIG. 2.

The sealing layer SE2 covers the entire conductive layer CL2 including the end portions E2a and E2b. The sealing layer SE2 is in contact with, of each side surface SF2, the area which is not covered with the conductive layer CL2.

As shown in FIG. 6, the lower portion 61 which is adjacent to subpixel SP3 comprises a side surface SF3. The side surface SF3 consists of the respective side surfaces of the metal layers 611 and 612. In the example of FIG. 6, the side surface of the first metal layer 611 is retracted relative to the side surface of the second metal layer 612. By this configuration, a recess RSb along the upper surface of the rib 5 is formed in the side surface SF3.

In the example of FIG. 6, the upper electrode UE3 is not in contact with the side surface SF3 of the right partition 6. Alternatively, the upper electrode UE3 may be in contact with at least one of the side surfaces SF3 of the right and left partitions 6.

The conductive layer CL3 entirely covers the upper electrode UE3. Further, an end portion E3a of the conductive layer CL3 is in contact with the side surface SF3 of the partition 6 located on the right side of FIG. 6. More specifically, the conductive layer CL3 blocks the gap between the recess RSb and the rib 5, and is in contact with, of the side surface SF3, the area located above the recess RSb (part of the side surface of the second metal layer 612). The conductive layer CL3 and the upper electrode UE3 may fill at least part of the recess RSb.

The other end portion E3b of the conductive layer CL3 is located on the rib 5. In other words, in the example of FIG. 5, neither the upper electrode UE3 nor the conductive layer CL3 is in contact with the side surface SF3 of the left partition 6. It should be noted that the right partition 6 which is in contact with the upper electrode UE3 and the conductive layer CL3 corresponds to the first partition 6x which overlaps the contact hole CH3 in FIG. 2.

The sealing layer SE3 covers the entire conductive layer CL3 including the end portions E3a and E3b. The sealing layer SE3 is in contact with, of each side surface SF3, the area which is not covered with the conductive layer CL3.

As shown in FIG. 4 to FIG. 6, each of the upper electrodes UE1, UE2 and UE3 has thickness TO. The conductive layer CL1 has thickness T1. The conductive layer CL2 has thickness T2. The conductive layer CL3 has thickness T3. Thickness TO is the mean value of the thicknesses of some portions of each of the upper electrodes UE1, UE2 and UE3. Similarly, thicknesses T1, T2 and T3 are the mean values of the thicknesses of some portions of the conductive layers CL1, CL2 and CL3, respectively. In the example of FIG. 4 to FIG. 6, thicknesses T1, T2 and T3 are greater than thickness TO (T1, T2, T3>T0). For example, thicknesses T1, T2 and T3 are different from each other. It should be noted that at least two of them may be equal to each other.

As described above, the refractive indices of the cap layers CP1, CP2 and CP3 are less than those of the conductive layers CL1, CL2 and CL3. The cap layer CP1 and the conductive layer CL1 function as optical adjustment layers which improve the extraction efficiency of the light emitted by the organic layer OR1. Similarly, the cap layer CP2 and the conductive layer CL2 function as optical adjustment layers which improve the extraction efficiency of the light emitted by the organic layer OR2. The cap layer CP3 and the conductive layer CL3 function as optical adjustment layers which improve the extraction efficiency of the light emitted by the organic layer OR3.

In the example of FIG. 4 to FIG. 6, thickness T2 is greater than thickness T1, and thickness T3 is greater than thickness T2 (T1<T2<T3). As the thicknesses of the conductive layers CL1, CL2 and CL3 are different from each other in this manner, a good light extraction efficiency based on the colors (wavelengths) of the light emitted by the organic layers OR1, OR2 and OR3 can be realized.

As shown in FIG. 5, the recess RSa has depth Da. As shown in FIG. 6, the recess RSb has depth Db. For example, depth Db is greater than depth Da (Da<Db). It should be noted that the depths of the recesses RSa may be different from each other between the right and left partitions 6 in FIG. 5. Similarly, the depths of the recesses RSb may be different from each other between the right and left partitions 6 in FIG. 6.

It should be noted that the structure of subpixel SP1, SP2 or SP3 is not limited to the structures shown in FIG. 4 to FIG. 6.

Figure 7:
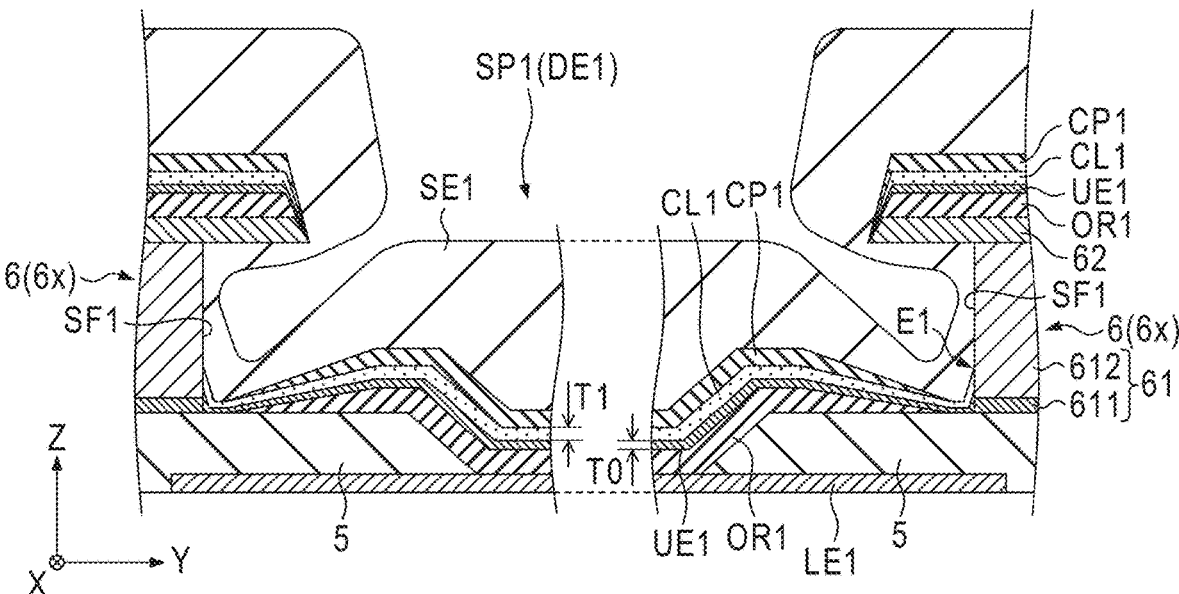
FIG. 7 is a schematic cross-sectional view showing another example of a structure which could be applied to a subpixel.

FIG. 7 is a schematic cross-sectional view showing another example of a structure which could be applied to subpixel SP1. In this example, the upper electrode UE1 and the conductive layer CL1 are in contact with the side surfaces SF1 of the right and left partitions 6 (first partitions 6x). Instead of this configuration, the upper electrode UE1 may not be in contact with the side surface SF1 of the right or left partition 6, and only the conductive layer CL1 may be in contact with these side surfaces SF1.

The structures of subpixels SP2 and SP3 could be modified in a manner similar to that of FIG. 7. Specifically, the conductive layer CL2 may be in contact with the side surfaces SF2 of the right and left partitions 6 shown in FIG. 5. The conductive layer CL3 may be in contact with the side surfaces SF3 of the right and left partitions 6 shown in FIG. 6.

Now, this specification explains the manufacturing method of the display device DSP.

Figure 8:
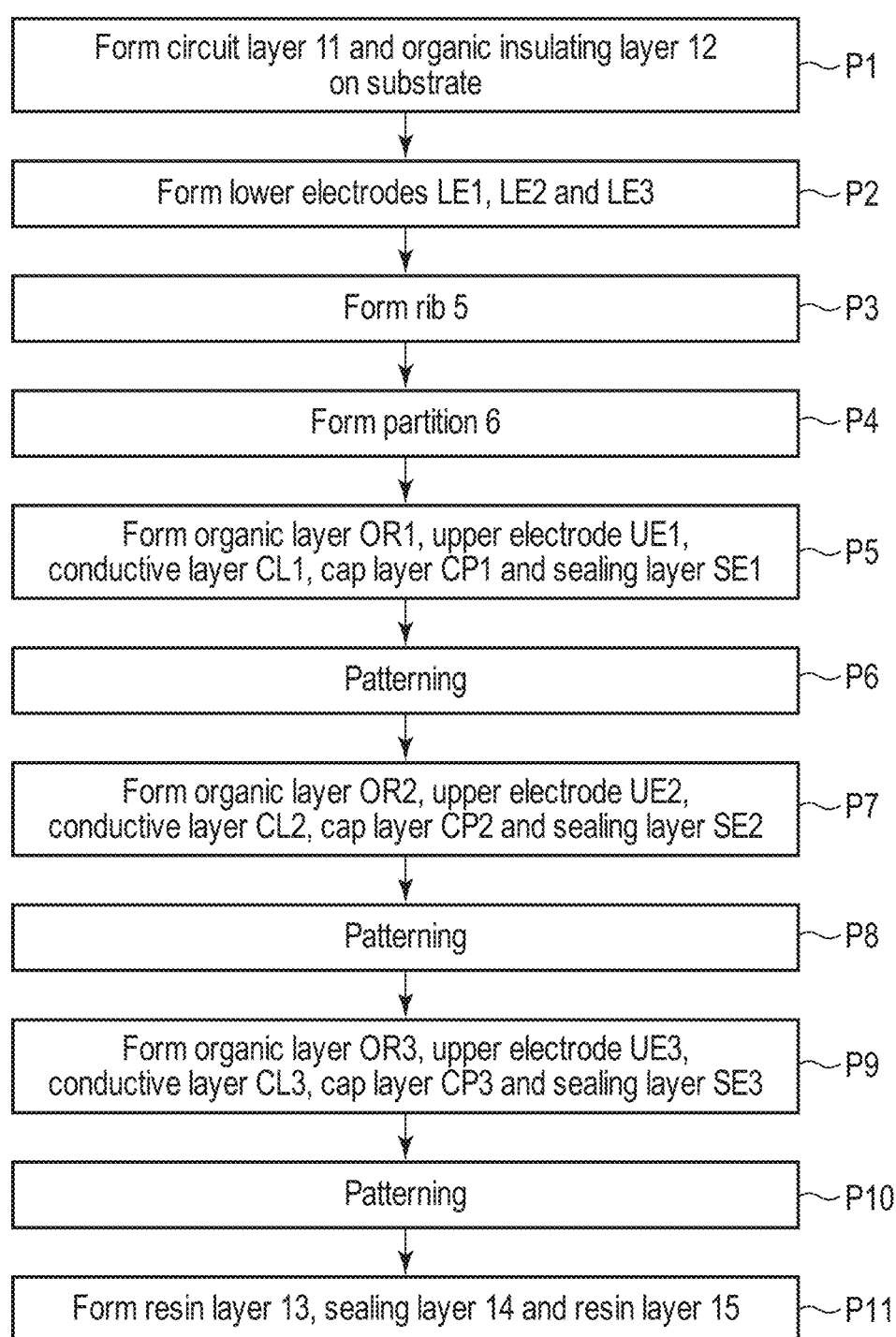
FIG. 8 is a flowchart showing an example of the manufacturing method of the display device.

FIG. 8 is a flowchart showing an example of the manufacturing method of the display device DSP. Each of FIG. 9 to FIG. 17 is a schematic cross-sectional view showing part of the manufacturing process of the display device DSP. In FIG. 9 to FIG. 17, the substrate 10, the circuit layer 11 and the like are omitted.

To manufacture the display device DSP, first, the circuit layer 11 and the organic insulating layer 12 are formed on the substrate 10 (process P1).

Figure 9:
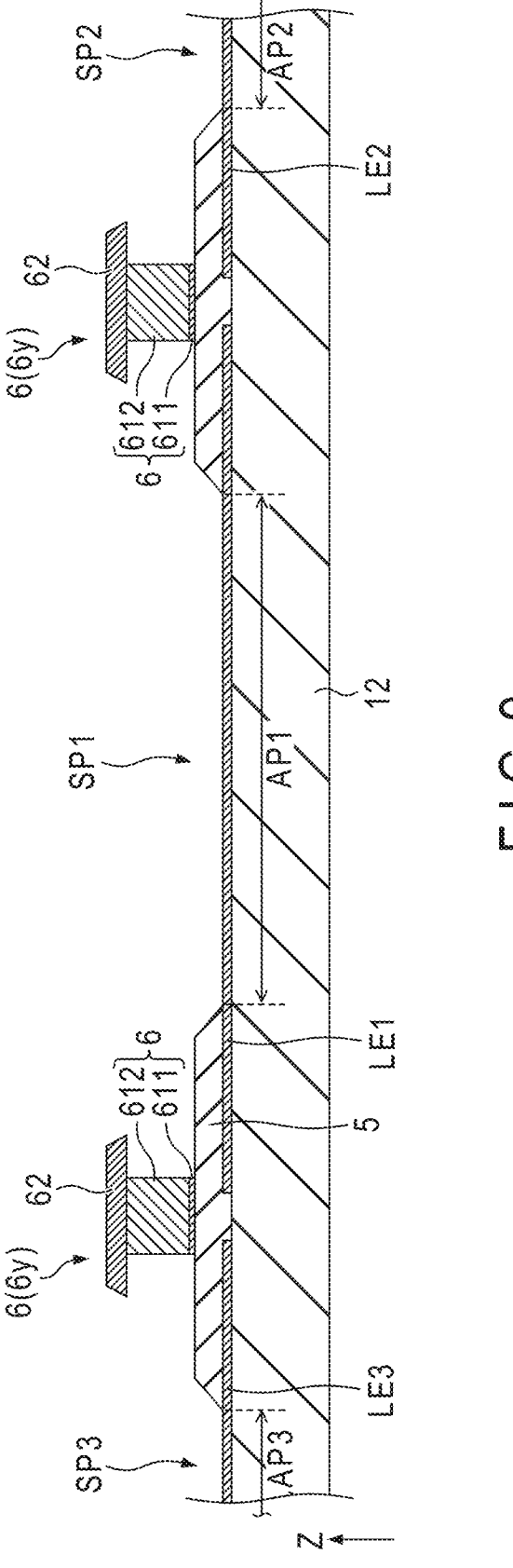
FIG. 9 is a schematic cross-sectional view showing part of the manufacturing process of the display device.

After process P1, as shown in FIG. 9, the lower electrodes LE1, LE2 and LE3 are formed on the organic insulating layer 12 (process P2). The rib 5 which covers the lower electrodes LE1, LE2 and LE3 is formed (process P3). The partition 6 is formed on the rib 5 (process P4). The pixel apertures AP1, AP2 and AP3 may be formed before process P4 or may be formed after process P4.

After process P4, a process for forming the display elements DE1, DE2 and DE3 is performed. In the present embodiment, this specification assumes a case where the display element DE1 is formed firstly, and the display element DE2 is formed secondly, and the display element DE3 is formed lastly. It should be noted that the formation order of the display elements DE1, DE2 and DE3 is not limited to this example.

Figure 10:
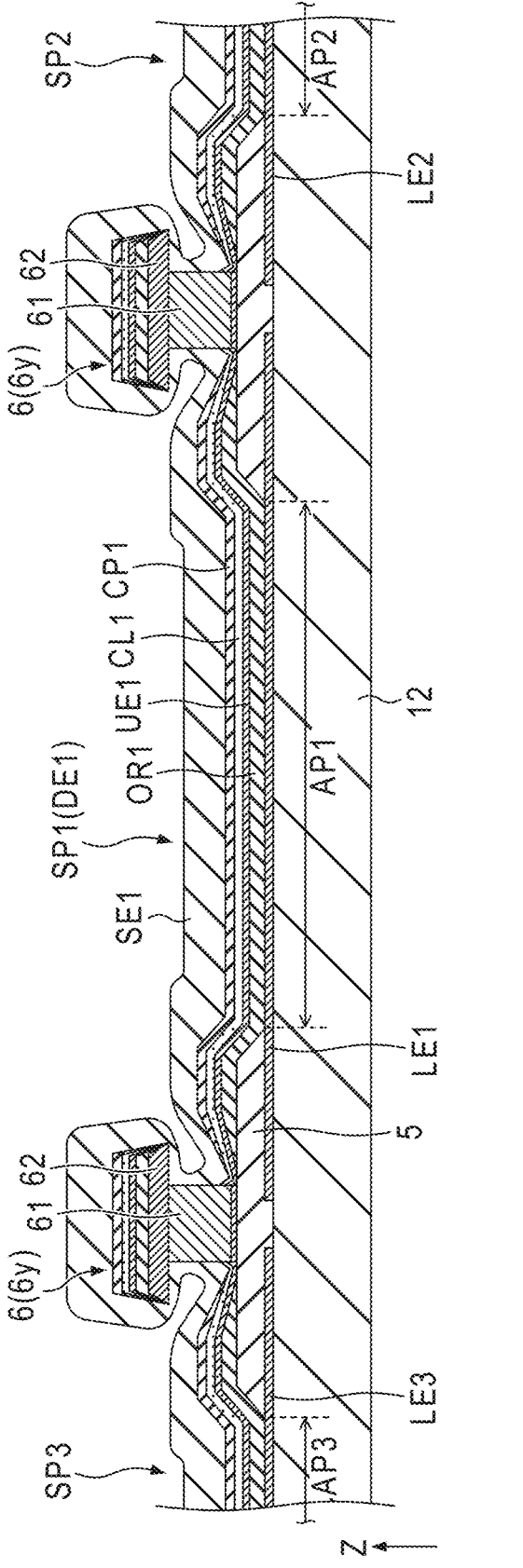
FIG. 10 is a schematic cross-sectional view showing a manufacturing process following FIG. 9.

To form the display element DE1, firstly as shown in FIG. 10, the organic layer OR1 which is in contact with the lower electrode LE1 through the pixel aperture AP1, the upper electrode UE1 which covers the organic layer OR1, the conductive layer CL1 which covers the upper electrode UE1 and the cap layer CP1 which covers the conductive layer CL1 are formed in order by vapor deposition, and further, the sealing layer SE1 which continuously covers the cap layer CP1 and the partition 6 is formed by chemical vapor deposition (CVD) (process P5).

These organic layer OR1, upper electrode UE1, conductive layer CL1, cap layer CP1 and sealing layer SE1 are formed in at least the entire display area DA and are provided in subpixels SP2 and SP3 as well as subpixel SP1. The organic layer OR1, the upper electrode UE1, the conductive layer CL1 and the cap layer CP1 are divided by the partition 6 having an overhang shape.

It should be noted that the section of FIG. 10 corresponds to, for example, that of FIG. 3. All of the partitions 6 shown in FIG. 10 correspond to the second partitions 6y shown in FIG. 2. In the example of FIG. 10, the upper electrode UE1 and the conductive layer CL1 are in contact with the side surfaces of the lower portions 61 of these second partitions 6y. Alternatively, at least one of the upper electrode UE1 and the conductive layer CL1 may not be in contact with the lower portions 61 of the second partitions 6y.

As shown in FIG. 4, the upper electrode UE1 and the conductive layer CL1 are in contact with at least one of the side surfaces SF1 of the first partitions 6x which are adjacent to subpixel SP1.

FIG. 11 is a schematic diagram showing an evaporation method for obtaining the structure of such a subpixel SP1. Here, for example, the figure shows the state in which the conductive layer CL1 is formed by the evaporation material M emitted from the nozzle N of an evaporation source 100. The evaporation source 100 and the substrate as the evaporation target are relatively moved in a conveyance direction TD parallel to, for example, the second direction Y.

The evaporation material M is emitted from the nozzle N while spreading. The emission direction RD of the evaporation material M (or the extension direction of the nozzle N) inclines with respect to a third direction Z so as to face the partition 6 located on the right side of FIG. 11 (the first partition 6x overlapping the contact hole CH1). Thus, the evaporation material M is satisfactorily attached to the side surface SF1 of the right partition 6. To the contrary, the evaporation material M which goes to the side surface SF1 of the partition 6 located on the left side of FIG. 11 is blocked by the upper portion 62. Thus, the evaporation material M is not easily attached to this side surface SF1.

It should be noted that the organic layer OR1, the upper electrode UE1 and the cap layer CP1 are formed by a similar evaporation method. Thus, as shown in FIG. 4, the arrangement of the organic layer OR1, the upper electrode UE1, the conductive layer CL1 and the cap layer CP1 is one-sided within subpixel SP1 in the Y-Z section.

When the evaporation method of FIG. 11 is used, the conductive layer CL1 or the upper electrode UE1 is satisfactorily attached to the side surface SF1 of one of the partitions 6. In this manner, stable conduction can be assured between the upper electrode UE1 and the conductive layer CL1 and the partition 6.

In the flowchart of FIG. 8, after process P5, the organic layer OR1, the upper electrode UE1, the conductive layer CL1, the cap layer CP1 and the sealing layer SE1 are patterned (process P6). In this patterning, as shown in FIG. 12, a resist R is provided on the sealing layer SE1. The resist R covers subpixel SP1 and part of the partition 6 around the subpixel. Subsequently, as shown in FIG. 13, of the sealing layer SE1, the portion exposed from the resist R is removed by dry etching using the resist R as a mask. Specifically, of the sealing layer SE1, the portion located above the lower electrode LE1 remains. The remaining sealing layer SE1 is partly located on the partition 6 surrounding subpixel SP1.

Subsequently, as shown in FIG. 14, of the organic layer OR1, the upper electrode UE1, the conductive layer CL1 and the cap layer CP1, the portions exposed from the resist R are removed by etching using the resist R as a mask. For example, this etching includes wet etching and dry etching processes which are performed in order for the cap layer CP1, the conductive layer CL1, the upper electrode UE1 and the organic layer OR1.

For example, in the wet etching of this patterning, the partition 6 could be partly damaged. When, as described above, the first metal layer 611 contains molybdenum, and the second metal layer 612 contains aluminum, mainly the first metal layer 611 is corroded by wet etching. As a result, as shown in the enlarged views of FIG. 14, the recess RSa could be formed in the side surface SF2 of the partition 6 which is adjacent to subpixel SP2, and the recess RSb could be formed in the side surface SF3 of the partition 6 which is adjacent to subpixel SP3. At this point, the recesses RSa and RSb have substantially the same depth (Da).

Figure 15:
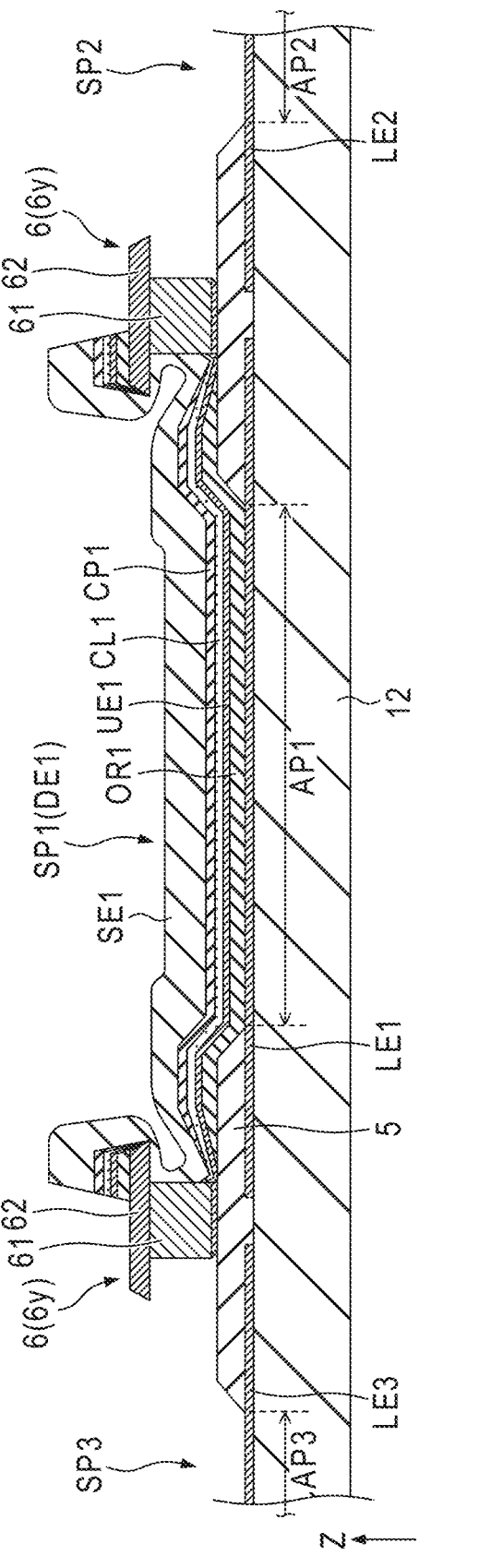
FIG. 15 is a schematic cross-sectional view showing a manufacturing process following FIG. 14.

After the process shown in FIG. 14, the resist R is removed. This process allows the acquisition of the following substrate. As shown in FIG. 15, in the substrate, the display element DE1 and the sealing layer SE1 are formed in subpixel SP1, and neither a display element nor a sealing layer is formed in subpixel SP2 or subpixel SP3.

The display element DE2 is formed by a procedure similar to that of the display element DE1. Specifically, after process P6, the organic layer OR2 which is in contact with the lower electrode LE2 through the pixel aperture AP2, the upper electrode UE2 which covers the organic layer OR2, the conductive layer CL2 which covers the upper electrode UE2 and the cap layer CP2 which covers the conductive layer CL2 are formed in order by vapor deposition, and further, the sealing layer SE2 which continuously covers the cap layer CP2 and the partition 6 is formed by CVD (process P7). These organic layer OR2, upper electrode UE2, conductive layer CL2, cap layer CP2 and sealing layer SE2 are formed in at least the entire display area DA and are provided in subpixels SP1 and SP3 as well as subpixel SP2.

The evaporation method of the organic layer OR2, the upper electrode UE2, the conductive layer CL2 and the cap layer CP2 is similar to the method explained with reference to FIG. 11. It should be noted that the direction of the inclination of the evaporation source 100 is the opposite direction of the example of FIG. 11. In this manner, a structure similar to that of FIG. 5 can be obtained in the Y-Z section.

After process P7, the organic layer OR2, the upper electrode UE2, the conductive layer CL2, the cap layer CP2 and the sealing layer SE2 are patterned by wet etching and dry etching (process P8). The flow of this patterning is similar to that of process P6. Process P8 allows the acquisition of the following substrate. As shown in FIG. 16, in the substrate, the display element DE1 and the sealing layer SE1 are formed in subpixel SP1, and the display element DE2 and the sealing layer SE2 are formed in subpixel SP2, and neither a display element nor a sealing layer is formed in subpixel SP3.

The side surface SF3 of the partition 6 which is adjacent to subpixel SP3 could be damaged by the etching included in process P8. Specifically, as shown in the enlarged view of FIG. 16, the first metal layer 611 is further corroded from the state shown in FIG. 14. Thus, the recess RSb has a depth (Db) greater than that of the recess RSa of the side surface SF2.

When the recess RSa is formed, as shown in FIG. 16, the upper electrode UE2 is not in contact with the side surface SF2. Alternatively, there is a possibility that the upper electrode UE2 is disconnected at the position of the recess RSa even if the upper electrode UE2 is in contact with the side surface SF2. Even in this case, the conductive layer CL2 which is thicker than the upper electrode UE2 is in contact with the side surface SF2 without being disconnected in the recess RSa.

The display element DE3 is formed by a procedure similar to the procedures of the display elements DE1 and DE2. Specifically, after process P8, the organic layer OR3 which is in contact with the lower electrode LE3 through the pixel aperture AP3, the upper electrode UE3 which covers the organic layer OR3, the conductive layer CL3 which covers the upper electrode UE3 and the cap layer CP3 which covers the conductive layer CL3 are formed in order by vapor deposition, and further, the sealing layer SE3 which continuously covers the cap layer CP3 and the partition 6 is formed by CVD (process P9). These organic layer OR3, upper electrode UE3, conductive layer CL3, cap layer CP3 and sealing layer SE3 are formed in at least the entire display area DA and are provided in subpixels SP1 and SP2 as well as subpixel SP3.

The evaporation method of the organic layer OR3, the upper electrode UE3, the conductive layer CL3 and the cap layer CP3 is similar to the method explained with reference to FIG. 11. In this manner, a structure similar to that of FIG. 6 can be obtained in the Y-Z section.

After process P9, the organic layer OR3, the upper electrode UE3, the conductive layer CL3, the cap layer CP3 and the sealing layer SE3 are patterned by wet etching and dry etching (process P10). The flow of this patterning is similar to the flows of processes P6 and P8.

Process P10 allows the acquisition of the following substrate. As shown in FIG. 17, in the substrate, the display element DE1 and the sealing layer SE1 are formed in subpixel SP1, and the display element DE2 and the sealing layer SE2 are formed in subpixel SP2, and the display element DE3 and the sealing layer SE3 are formed in subpixel SP3.

When the recess RSb is formed, as shown in the enlarged view of FIG. 17, the upper electrode UE3 is not in contact with the side surface SF3. Alternatively, there is a possibility that the upper electrode UE3 is disconnected at the position of the recess RSb even if the upper electrode UE3 is in contact with the side surface SF3. Even in this case, the conductive layer CL3 which is thicker than the upper electrode UE3 is in contact with the side surface SF3 without being disconnected in the recess RSb.

After the display elements DE1, DE2 and DE3 and the sealing layers SE1, SE2 and SE3 are formed, the resin layer 13, sealing layer 14 and resin layer 15 shown in FIG. 3 are formed in order (process P11). By this process, the display device DSP is completed.

In the present embodiment described above, the conductive layers CL1, CL2 and CL3 are formed on the upper electrodes UE1, UE2 and UE3, respectively, each of which is formed of a metal material such as an alloy of magnesium and silver. By this configuration, compared with a case where the conductive layer CL1, CL2 or CL3 is not provided, the film thicknesses of the cathodes of the display elements DE1, DE2 and DE3 (the total film thicknesses of the upper electrodes UE1, UE2 and UE3 and the conductive layers CL1, CL2 and CL3) are increased, and the electric resistance can be decreased.

In a case where the conductive layer CL1, CL2 or CL3 is not provided, if the upper electrode UE1, UE2 or UE3 is disconnected because of a step of the rib 5, there is a possibility that common voltage cannot be applied to the entire upper electrode UE1, UE2 or UE3. To the contrary, in a case where the conductive layers CL1, CL2 and CL3 which are thicker than the upper electrodes UE1, UE2 and UE3 are provided, even if the upper electrode UE1, UE2 or UE3 is disconnected, common voltage can be satisfactorily applied to the entire upper electrodes. The conductive layers CL1, CL2 and CL3 which are formed of the organic conductive materials described above are more desirable as they are not easily damaged compared to inorganic materials.

In a case where the recesses RSa and RSb are formed in the side surfaces SF2 and SF3 of the partition 6 as shown in FIG. 5 and FIG. 6, the upper electrode UE2 or UE3 is not in contact with the side surface SF2 or SF3, or there is a possibility that the upper electrode UE2 or UE3 is disconnected by the recess RSa or RSb even if the upper electrodes are in contact with the side surfaces. Even in this case, when the conductive layers CL2 and CL3 are in contact with the side surfaces SF2 and SF3, respectively, the upper electrodes UE2 and UE3 can be electrically connected to the partition 6 in a good manner.

In addition, when the conductive layers CL1, CL2 and CL3 function as part of optical adjustment layers as described above, the manufacturing cost can be reduced compared with a case where layers for optical adjustment are separately provided.

Various desirable effects can be obtained from the present embodiment in addition to the examples shown here.

All of the display devices and manufacturing methods thereof that can be implemented by a person of ordinary skill in the art through arbitrary design changes to the display device and manufacturing method thereof described above as the embodiments of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiments by adding or deleting a structural element or changing the design of a structural element, or by adding or omitting a step or changing the condition of a step, all of the modifications fall within the scope of the present invention as long as they are in keeping with the spirit of the invention.

Further, other effects which may be obtained from the above embodiments and are self-explanatory from the descriptions of the specification or can be arbitrarily conceived by a person of ordinary skill in the art are considered as the effects of the present invention as a matter of course.

What is claimed is:

1. A display device comprising:
a lower electrode;
a rib which covers a part of the lower electrode and comprises an aperture overlapping the lower electrode;
a partition comprising a lower portion provided on the rib and an upper portion which protrudes from a side surface of the lower portion;
an upper electrode which faces the lower electrode and is formed of a metal material;
an organic layer which is located between the lower electrode and the upper electrode and emits light based on a potential difference between the lower electrode and the upper electrode; and
a transparent conductive layer which covers the upper electrode, wherein
the side surface of the lower portion includes a recess, and
the conductive layer is in contact with, of the side surface of the lower portion, an area located above the recess.

2. The display device of claim 1, wherein
the recess is formed along an upper surface of the rib, and
the conductive layer blocks a gap between the recess and the rib.

3. The display device of claim 1, wherein
the conductive layer is thicker than the upper electrode.

4. The display device of claim 1, further comprising a cap layer which covers the conductive layer, wherein
a refractive index of the conductive layer is different from a refractive index of the cap layer.

5. The display device of claim 4, further comprising a sealing layer provided on the cap layer, wherein
the sealing layer covers an end portion of the conductive layer.

6. The display device of claim 1, further comprising a first subpixel, a second subpixel and a third subpixel each of which includes the lower electrode, the organic layer, the upper electrode and the conductive layer, wherein
thicknesses of the conductive layers of the first subpixel, the second subpixel and the third subpixel are different from each other.

7. The display device of claim 6, wherein
the organic layer of the first subpixel emits blue light based on the potential difference between the lower and upper electrodes of the first subpixel,
the organic layer of the second subpixel emits green light based on the potential difference between the lower and upper electrodes of the second subpixel,
the organic layer of the third subpixel emits red light based on the potential difference between the lower and upper electrodes of the third subpixel,
the conductive layer of the second subpixel is thicker than the conductive layer of the first subpixel, and
the conductive layer of the third subpixel is thicker than the conductive layer of the second subpixel.

15

16

8. A display device comprising:

a lower electrode;

a rib which covers a part of the lower electrode and comprises an aperture overlapping the lower electrode;

a partition comprising a lower portion provided on the rib and an upper portion which protrudes from a side surface of the lower portion;

an upper electrode which faces the lower electrode and is formed of a metal material;

an organic layer which is located between the lower electrode and the upper electrode and emits light based on a potential difference between the lower electrode and the upper electrode; and a transparent conductive layer which covers the upper electrode, wherein the lower portion includes a first metal layer, and a second metal layer provided on the first metal layer, and the conductive layer is in contact with a side surface of the second metal layer.

9. The display device of claim 8, wherein a side surface of the first metal layer is retracted relative to the side surface of the second metal layer.

10. The display device of claim 8, wherein the conductive layer is thicker than the upper electrode.

11. The display device of claim 8, further comprising a cap layer which covers the conductive layer, wherein a refractive index of the conductive layer is different from a refractive index of the cap layer.

12. The display device of claim 11, further comprising a sealing layer provided on the cap layer, wherein the sealing layer covers an end portion of the conductive layer.

13. The display device of claim 8, further comprising a first subpixel, a second subpixel and a third subpixel each of which includes the lower electrode, the organic layer, the upper electrode and the conductive layer, wherein thicknesses of the conductive layers of the first subpixel, the second subpixel and the third subpixel are different from each other.

14. The display device of claim 13, wherein the organic layer of the first subpixel emits blue light based on the potential difference between the lower and upper electrodes of the first subpixel, the organic layer of the second subpixel emits green light based on the potential difference between the lower and upper electrodes of the second subpixel, the organic layer of the third subpixel emits red light based on the potential difference between the lower and upper electrodes of the third subpixel, the conductive layer of the second subpixel is thicker than the conductive layer of the first subpixel, and the conductive layer of the third subpixel is thicker than the conductive layer of the second subpixel.

15. A display device comprising:

a lower electrode;

a rib which covers a part of the lower electrode and comprises an aperture overlapping the lower electrode;

a partition comprising a lower portion provided on the rib and an upper portion which protrudes from a side surface of the lower portion;

an upper electrode which faces the lower electrode and is formed of a metal material;

an organic layer which is located between the lower electrode and the upper electrode and emits light based on a potential difference between the lower electrode and the upper electrode; and a transparent conductive layer which covers the upper electrode, wherein the conductive layer is formed of an organic conductive material and is in contact with the side surface of the lower portion.

16. The display device of claim 15, wherein the conductive layer is thicker than the upper electrode.

17. The display device of claim 15, further comprising a cap layer which covers the conductive layer, wherein a refractive index of the conductive layer is different from a refractive index of the cap layer.

18. The display device of claim 17, further comprising a sealing layer provided on the cap layer, wherein the sealing layer covers an end portion of the conductive layer.

19. The display device of claim 15, further comprising a first subpixel, a second subpixel and a third subpixel each of which includes the lower electrode, the organic layer, the upper electrode and the conductive layer, wherein thicknesses of the conductive layers of the first subpixel, the second subpixel and the third subpixel are different from each other.

20. The display device of claim 19, wherein the organic layer of the first subpixel emits blue light based on the potential difference between the lower and upper electrodes of the first subpixel, the organic layer of the second subpixel emits green light based on the potential difference between the lower and upper electrodes of the second subpixel, the organic layer of the third subpixel emits red light based on the potential difference between the lower and upper electrodes of the third subpixel, the conductive layer of the second subpixel is thicker than the conductive layer of the first subpixel, and the conductive layer of the third subpixel is thicker than the conductive layer of the second subpixel.

* * * * *